(12) United States Patent
Sakurai

(10) Patent No.: US 7,623,057 B2
(45) Date of Patent: Nov. 24, 2009

(54) ANALOG DIGITAL CONVERTER

(75) Inventor: Satoshi Sakurai, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/019,020

(22) Filed: Jan. 24, 2008

(65) Prior Publication Data
US 2008/0191922 A1 Aug. 14, 2008

(30) Foreign Application Priority Data
Jan. 25, 2007 (JP) .............................. 2007-014866

(51) Int. Cl.
*H03M 1/12* (2006.01)
(52) U.S. Cl. ..................... 341/172; 341/155; 341/156
(58) Field of Classification Search ................. 341/172, 341/155, 156, 161, 119, 120, 162
See application file for complete search history.

(56) References Cited

U.S. PATENT DOCUMENTS

| | | | | |
|---|---|---|---|---|
| 5,099,239 A | * | 3/1992 | Bruce et al. ................. | 341/155 |
| 5,629,700 A | * | 5/1997 | Kumamoto et al. ......... | 341/161 |
| 6,127,958 A | | 10/2000 | Chang et al. | |
| 6,229,472 B1 | * | 5/2001 | Nishida ....................... | 341/161 |
| 6,653,966 B1 | * | 11/2003 | van der Goes et al. ...... | 341/156 |
| 6,700,524 B2 | | 3/2004 | Naka et al. | |
| 6,847,319 B1 | * | 1/2005 | Stockstad ................... | 341/119 |
| 6,914,550 B2 | * | 7/2005 | Cai ............................ | 341/155 |
| 7,023,372 B1 | * | 4/2006 | Singh et al. ................. | 341/155 |
| 2004/0125008 A1 | | 7/2004 | Yamaji | |
| 2005/0140537 A1 | * | 6/2005 | Waltari ....................... | 341/162 |
| 2006/0077086 A1 | | 4/2006 | Cringean | |

* cited by examiner

*Primary Examiner*—Jean B Jeanglaude
(74) *Attorney, Agent, or Firm*—Turocy & Watson, LLP

(57) ABSTRACT

In one aspect, provided is an A/D converter including: a plurality of capacitor networks each including a first switch group a capacitor group; a second switch group; and a plurality of reference voltage selectors; a sampling unit grounded at one end thereof; a plurality of A/D converters; and converting means; and a plurality of switch networks each of which connects a corresponding one of the plurality of the capacitor networks to any one of the sampling unit and the plurality of A/D converters in one-to-one correspondence, and in which converter the switch networks change the connections between the plurality of capacitor networks, the sampling unit and the plurality of A/D converters, at each predetermined time intervals, so that a pipeline operation is performed.

6 Claims, 10 Drawing Sheets

US 7,623,057 B2

ANALOG DIGITAL CONVERTER

CROSS-REFERENCE TO RELATED APPLICATIONS

This application is based upon and claims the benefit of priority from the prior Japanese Patent Application No. 2007-14866, filed Jan. 25, 2007, the entire contents of which are incorporated herein by reference.

BACKGROUND OF THE INVENTION

1. Field of the Invention

The present invention relates to an analog-to-digital converter for converting an analog signal into a digital signal.

2. Description of the Related Art

As analog-to-digital converters (hereinafter, referred to as "A/D converters") converting analog signals into digital signals, a pipeline A/D converter has been known, which performs an analog to digital conversion (hereinafter, referred to as an "A/D conversion") in each stage while sending signals in pipeline to subsequent stages (see, for example, Japanese Patent Laid-Open No. 2004-214905).

Further, a cyclic A/D converter which is configurable with a smaller number of devices than the pipeline A/D converter has also been known (see, for example, Japanese Patent No. 3046005).

As disclosed in, for example, Japanese Patent Laid-Open No. 2004-214905, in these A/D converters, after the analog signals are sampled and held in a sample-and-hold circuit, the A/D conversion is performed by repeating conversion stages.

In each conversion stage, a residual signal calculated in the previous stage is used to calculate an A/D conversion result of the residual signal, and also a new residual signal. Then, the A/D conversion result is sent to a digital synthesis circuit, while the new residual signal is sent to the next stage. The calculation of a residual signal is called an MDAC (Multiplying Digital to Analogue Conversion) calculation.

As disclosed in, for example, FIG. 3 of Japanese Patent Laid-Open No. 2004-214905, each conversion stage includes a sub-A/D converter, and an MDAC circuit. The MDAC circuit calculates the residual signal.

The MDAC circuit in FIG. 3 of Japanese Patent Laid-Open No. 2004-214905 is, specifically, configured by a circuit having a capacitor as disclosed in FIG. 5 of Japanese Patent Laid-Open No. 2004-214905. In a circuit disclosed in FIG. 5 of Japanese Patent Laid-Open No. 2004-214905, after the residual signal calculated in a previous stage is sampled and held in a capacitor as a charge, an MDAC calculation is performed.

Here, in order to increase the accuracy of the A/D conversion, it is necessary to increase the accuracy of calculation of an A/D conversion result and a residual signal in each conversion stage. Since both the A/D conversion result and the residual signal are calculated by using a residual signal calculated in the previous conversion stage, it is necessary to cause a sample-and-hold accuracy of the residual signal calculated in the previous conversion stage to converge to a certain range.

That is, in order to increase the accuracy of the A/D conversion, a settling time for the sample-and-hold accuracy of the residual signal to converge to a certain range is necessary. This requires some convergence time.

As means to correct an error in A/D conversion on each conversion stage, an A/D converter which corrects an error in digital bit data obtained through an A/D conversion has been also provided (see, for example, Japanese Patent Laid-Open No. 2003-174364).

In this A/D converter, an A/D conversion result is an output in binary code having 1.5 bits of information and has 0.5 bits of redundancy. Since the A/D converter has the redundancy, the accuracy requirement of an A/D conversion part is relaxed compared with that of an A/D converter having no redundancy.

However, even using this method, the problem still remains that sampling is still necessary to output a residual signal to a subsequent stage, and a certain amount of settling time is required.

BRIEF SUMMARY OF THE INVENTION

According to an aspect of the present invention, provided is an A/D converter including: a first switch group configured to be connected to an input terminal into which an analog signal is inputted; a capacitor group configured to be connected to the first switch group, and to store therein the analog signal inputted from the input terminal as a charge; a second switch group configured to be connected to the capacitor group, and the second switch configured to transfer the charge in the capacitor group; a operational amplifier configured to be connected to the capacitor group and the second switch group, the operational amplifier configured to subtract a predetermined voltage from a voltage generated in the capacitor group in conjunction with the transfer of the charge, and the operational amplifier then configured to set, as an output voltage, a voltage obtained by amplifying the result of the subtraction; converter configured to be connected to the operational amplifier, and the converter configured to convert the output voltage into a digital value of a predetermined number of bits, including a redundancy bit; and a plurality of reference voltage selectors configured to be connected to the first switch group and the capacitor group, and each of which selects the predetermined voltage in accordance with the digital value, and in which the connecting of the capacitor group to the operational amplifier, and the voltage selection of each reference voltage selector, are performed for a plurality of times.

Further, according to another aspect of the present invention, provided is also an A/D converter including: a plurality of capacitor networks each including a first switch group configured to be connected to an input terminal into which an analog signal is inputted; a capacitor group configured to be connected to the first switch group, and the capacitor group configured to store the analog signal inputted from the input terminal as a charge; a second switch group configured to be connected to the capacitor group, and the second switch group configured to transfer the charge in the capacitor group; and a plurality of reference voltage selectors configured to be connected to the first switch group and the capacitor group, and each of which selects a predetermined voltage in accordance with the digital value; a sampling unit grounded at one end thereof; a plurality of A/D converters each including a operational amplifier configured to subtract the predetermined voltage from a voltage generated in the capacitor group in conjunction with the transfer of the charge, and the plurality of A/D converters configured to then sets, as an output voltage, a voltage obtained by amplifying the result of the subtraction; and converter configured to be connected to the operational amplifier, and the converter configured to convert the output voltage into a digital value of a predetermined number of bits, including a redundancy bit; and a plurality of switch networks each of which connects a corresponding one of the plurality of the capacitor networks to any one of the sampling unit and the plurality of A/D converters in one-to-one correspondence, and in which converter the switch networks change the connections between the plurality of capacitor networks, the sampling unit and the plurality of A/D converters, at each predetermined time intervals, so that a pipeline operation is performed.

DETAILED DESCRIPTION OF THE INVENTION

First Embodiment

Figure 1:
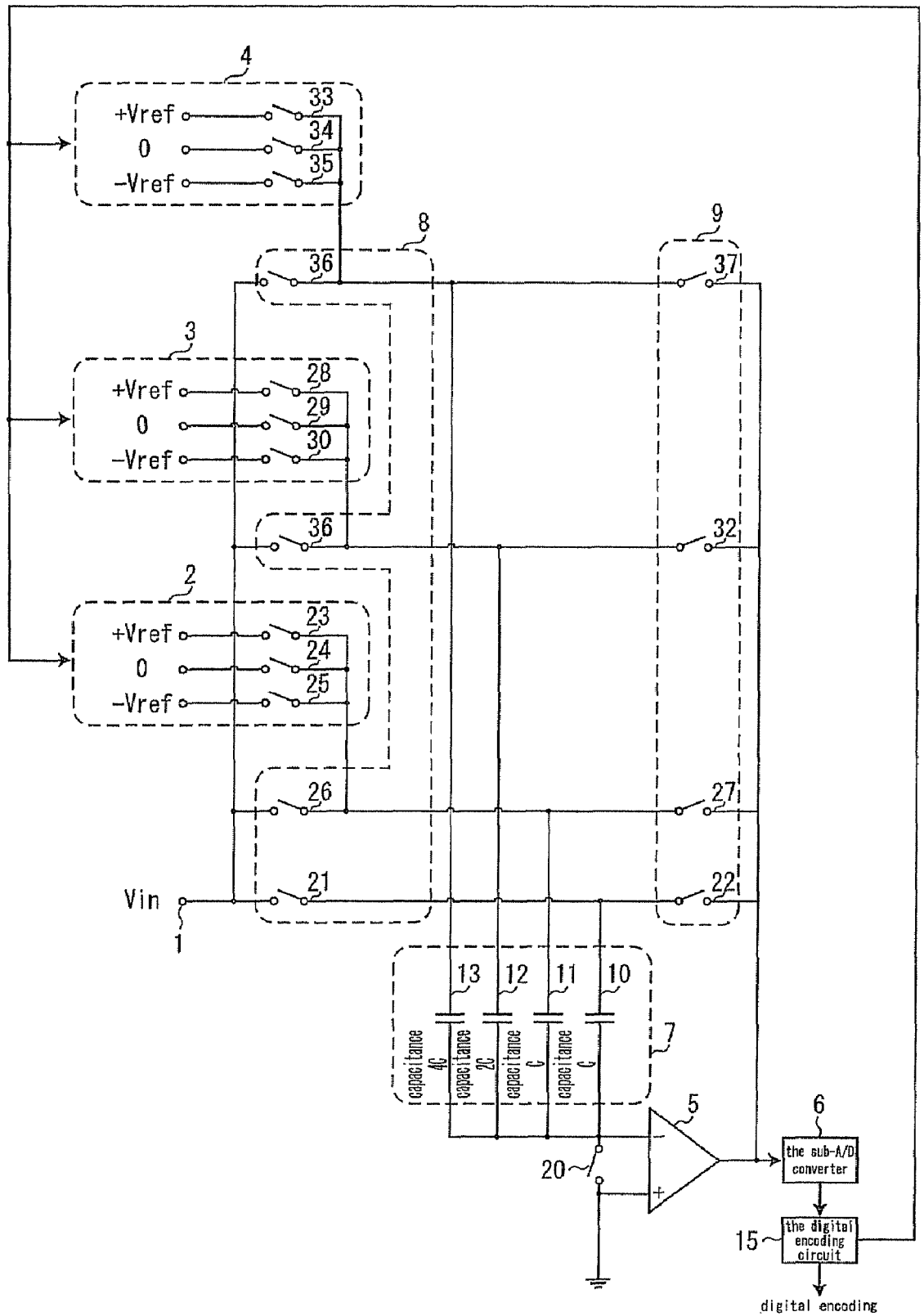
FIG. 1 is a circuit diagram showing a cyclic A/D converter of a first embodiment.

An A/D converter of a first embodiment of the present invention will be described with reference to the accompanying drawings.

First, a configuration and connections of the first embodiment will be described with reference to FIG. 1. Next, referring to FIG. 2, an operation of a sub-A/D converter 6 will be described. In the operation, the sub-A/D converter 6 A/D converts an output voltage of the operational amplifier 5 into a digital value in binary code. Subsequently, referring to FIG. 3, digital encoding method in the digital encoding circuit 15 will be described. Next, referring to FIGS. 4 to 8, operation procedures will be described. In the operation procedures, reference voltage selectors 2 to 4 select predetermined voltages in accordance with a digital value in binary code converted by the sub-A/D converter 6, and an analog signal Vin inputted from an external input terminal 1 is A/D converted.

Configuration of First Embodiment

First, a configuration and connections of the first embodiment will be described with reference to FIG. 1. FIG. 1 is a circuit diagram showing a cyclic A/D converter of the first embodiment.

As shown in FIG. 1, the A/D converter of this embodiment includes the external input terminal 1, reference voltage selectors 2 to 4, a capacitor group 7, a first switch group 8, a second switch group 9, the operational amplifier 5, a switch 20, the sub-A/D converter 6, and the digital encoding circuit 15.

The external input terminal 1 is a terminal to which an analog signal Vin is inputted.

When an absolute value of a reference voltage in the A/D converter of this embodiment is denoted as Vref, the reference voltage selectors 2 to 4 are circuits each selecting one of the following there voltages, a positive reference voltage +Vref, 0 volt, and a negative reference voltage −Vref, in accordance with a digital value in binary code, having 1.5 bits of information, converted by the sub-A/D converter 6. The reference voltage selector 2 includes switches 23 to 25, the reference voltage selector 3 includes switches 28 to 30, and the reference voltage selector 4 includes switches 33 to 35.

Further, digital values in binary code converted by sub-A/D converter 6 are supplied to the reference voltage selectors 2 to 4 through the digital encoding circuit 15. Referring to FIGS. 4 to 8, operation will be described. In the operation, the reference voltage selectors 2 to 4 select predetermined voltages according to the above digital value in binary code.

The operational amplifier 5 is an op-amp of three-terminal structure having an input terminal (−), an input terminal (+), and an output terminal. The switch 20 is connected between the input terminal (−) and the input terminal (+). The input terminal (+) is grounded. The sub-A/D converter 6 is connected to the output terminal.

Figure 2:
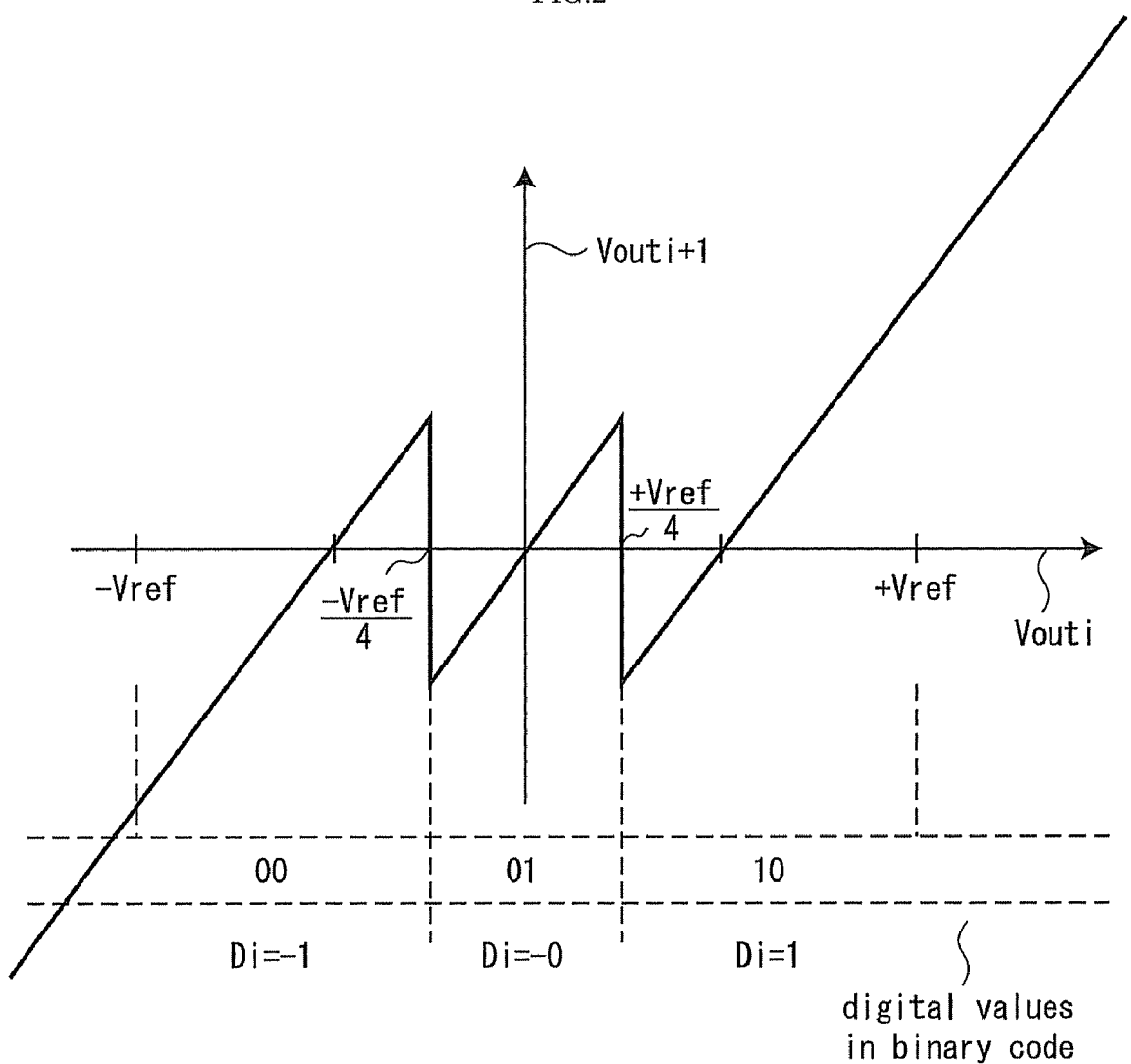
FIG. 2 is a view showing A/D conversion operation by a sub-A/D converter.

The sub-A/D converter 6 is an A/D converter having 0.5 bits of redundancy, and is a circuit converting a voltage held and outputted by the operational amplifier 5 into a digital value in binary code having 1.5 bits of information. The digital value in binary code is supplied to the digital encoding circuit 15. Referring to FIG. 2, an operation will be described. In the operation, the sub-A/D converter 6 converts an input into a digital value in binary code.

The digital encoding circuit 15 is a circuit performing an error correction by adding digital values converted by the sub-A/D converter 6, and performing 5-bit digital encoding. Further, the digital encoding circuit 15 supplies digital values in binary code supplied from the sub-A/D converter 6, to the reference voltage selectors 2 to 4.

The capacitor group 7 is a group of capacitors storing an analog signal Vin inputted from the external input terminal 1 as a charge and performing an MDAC calculation. Further, the capacitor group 7 includes a first capacitor 10, a second capacitor 11, a third capacitor 12, and a fourth capacitor 13.

The first capacitor 10 and the second capacitor 11 have the same capacitance C. The third capacitor 12 has a capacitance 2C double the capacitance of the first capacitor 10. The fourth capacitor 13 has a capacitor 4C four times the capacitance of the first capacitor 10.

The first switch group 8 is a group of switches which are closed when storing an analog signal Vin inputted from the external input switch 1 in the capacitor group 7 as a charge, and includes a switch 21, a switch 26, a switch 31, and a switch 36.

The second switch group 9 is a group of switches which are used when performing an MDAC calculation by switching a connection of a capacitor in the capacitor group 7, and includes a switch 22, a switch 27, a switch 32, and a switch 37.

Connection Relationships of First Embodiment

Next, connection relationships of respective devices will be described.

A common connection is established between one end of the switch 21 and one end of the switch 22, and this common connection point is connected to one end of the first capacitor 10. The switch 21 performs an ON/OFF operation between the external input terminal 1 and the one end of the first capacitor 10. The switch 22 performs an ON/OFF operation between the one end of the first capacitor 10 and the output terminal of the operational amplifier 5. The remaining end of the first capacitor 10 is connected to the input terminal (−) of the operational amplifier 5.

A common connection is established between one ends of the switches 23 to 27, and this common connection point is connected to one end of the second capacitor 11. The switch 23 performs an ON/OFF operation between the positive reference voltage +Vref and the one end of the second capacitor 11. The switch 24 performs an ON/OFF operation between 0 [V] and the one end of the second capacitor 11. The switch 25 performs an ON/OFF operation between the negative reference voltage −Vref and the one end of the second capacitor 11. The switch 26 performs an ON/OFF operation between the external input terminal 1 and the one end of the second capacitor 11. The switch 27 performs an ON/OFF operation between the one end of the second capacitor 11 and the output terminal of the operational amplifier 5. The remaining end of the second capacitor 11 is connected to the input terminal (−) of the operational amplifier 5.

A common connection is established between one ends of the switches 28 to 32, and this common connection point is connected to one end of the third capacitor 12. The switch 28 performs an ON/OFF operation between the positive reference voltage +Vref and the one end of the third capacitor 12. The switch 29 performs an ON/OFF operation between 0 [V] and the one end of the third capacitor 12. The switch 30 performs an ON/OFF operation between the negative reference voltage −Vref and the one end of the third capacitor 12. The switch 31 performs an ON/OFF operation between the external input terminal 1 and the one end of the third capacitor 12. The switch 32 performs an ON/OFF operation between the one end of the third capacitor 12 and the output terminal of the operational amplifier 5. The remaining end of the third capacitor 12 is connected to the input terminal (−) of the operational amplifier 5.

A common connection is established between one ends of the switches 33 to 37, and this common connection point is connected to one end of the fourth capacitor 13. The switch 33 performs an ON/OFF operation between the positive reference voltage +Vref and the one end of the fourth capacitor 13. The switch 34 performs an ON/OFF operation between 0 [V] and the one end of the fourth capacitor 13. The switch 35 performs an ON/OFF operation between the negative reference voltage −Vref and the one end of the fourth capacitor 13. The switch 36 performs an ON/OFF operation between the external input terminal 1 and the one end of the fourth capacitor 13. The switch 37 performs an ON/OFF operation between the one end of the fourth capacitor 13 and the output terminal of the operational amplifier 5. The remaining end of the fourth capacitor 13 is connected to the input terminal (−) of the operational amplifier 5.

(MDAC Calculation Operation)

Next, referring to FIG. 2, operation will be described. In the operation, the sub-A/D converter 6 converts an output voltage Vouti of the operational amplifier 5 into a digital value in binary code having 1.5 bit of information. Here, i is a value representing the number of times A/D conversions are made by the sub-A/D converter. In this embodiment, i represents 1, 2, 3 or 4. That is, Vouti takes four values from Vout1 to Vout4.

FIG. 2 is a view showing A/D conversion operation by sub-A/D converter 6. According to the principle of an A/D conversion shown in FIG. 2, a voltage Vouti inputted in sub-A/D converter 6 is converted into a digital value in binary code having 1.5 bit of information, according to the voltage range of the Vouti as follows.

[1] Case where Vouti is not greater than −Vref/4
The digital value in binary code is 00.
[2] Case where Vouti is between −Vref/4 and +Vref/4
The digital value in binary code is 01.
[3] Case where Vouti is not less than +Vref/4
The digital value in binary code is 10.

Subsequently, the MDAC calculation will be described. Vouti+1 is calculated based on Vouti using the MDAC calculation as follows.

$$Vouti+1 = 2 \times Vouti - Di \cdot Vref$$

$$(Di = -1, 0, 1)\ (i = 1, 2, 3) \tag{1}$$

Here, Di is a digital value used in the MDAC calculation. Since Vouti is a value up to Vout4, Di takes three values from D1 to D3. This Di follows the principle of the A/D conversion shown in FIG. 2, and is set to the following values according to Vouti.

[1] Case where Vouti is not greater than −Vref/4
Di=−1
[2] Case where Vouti is between −Vref/4 and +Vref/4
Di=0
[3] Case where Vouti is not less than +Vref/4
Di=+1

(Digital Encoding Operation)

Next, referring to FIG. 3, a method will be described. In the method, the digital encoding circuit 15 performs 5-bit digital encoding using a digital value in binary code converted by the sub-A/D converter 6.

Figure 3:
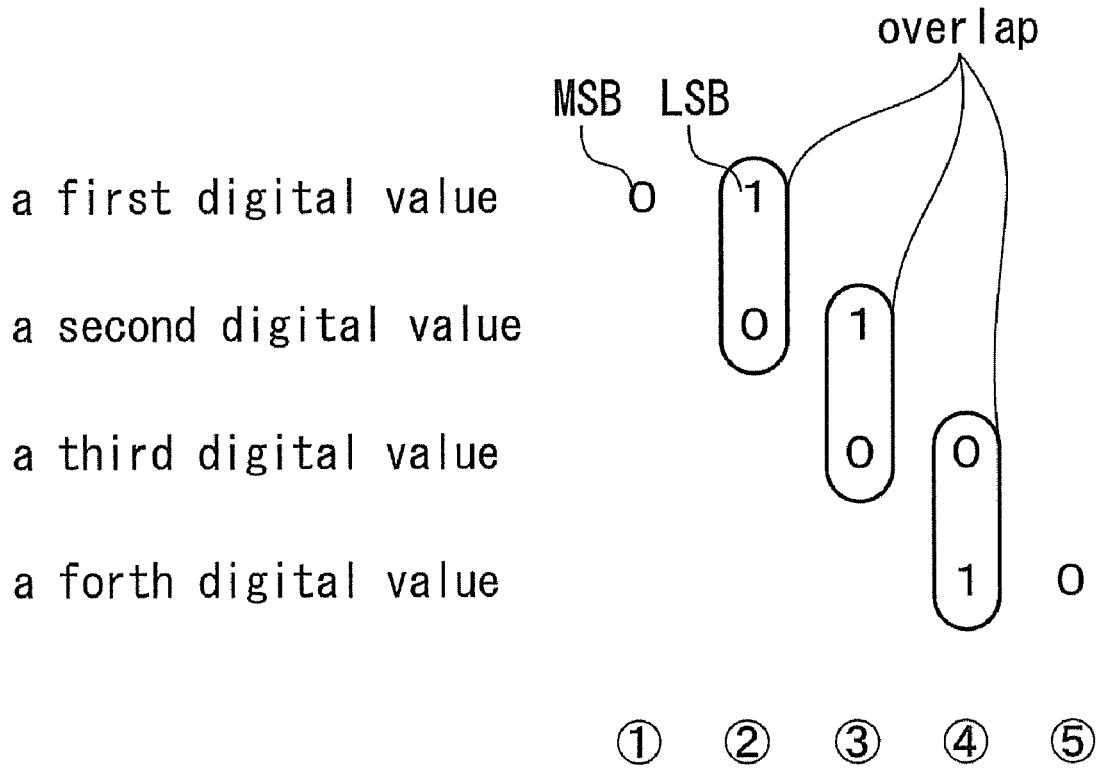
FIG. 3 is a view showing digital encoding by a digital encoding circuit.

FIG. 3 is a view showing a digital encoding method in the digital encoding circuit 15. As shown in FIG. 3, the digital encoding circuit 15 overlaps and adds digital values in binary code converted from the first time to the fourth time by the sub-A/D converter 6, so that 5-bit digital encoding is performed.

The overlap above represents a calculation such as an addition of an LSB of a first digital value and an MSB of a second digital value, or an addition of an LSB of the second digital value and an MSB of a third digital value.

When using this MDAC calculation and the digital encoding method shown in FIG. 3, an accurate digital value of a 5-bit conversion result can be obtained when the conversion error made by the sub-A/D converter 6 is less than ±Vref/4.

(A/D Conversion Operation)

Next, referring to FIGS. 5 to 8 based on FIG. 4, an operation procedure will be described. In the operation procedure, the reference voltage selectors 2 to 4 select predetermined voltages according to digital values in binary code converted by the sub-A/D converter 6, and an analog signal Vin inputted from the external input terminal 1 is A/D converted.

Figure 4:
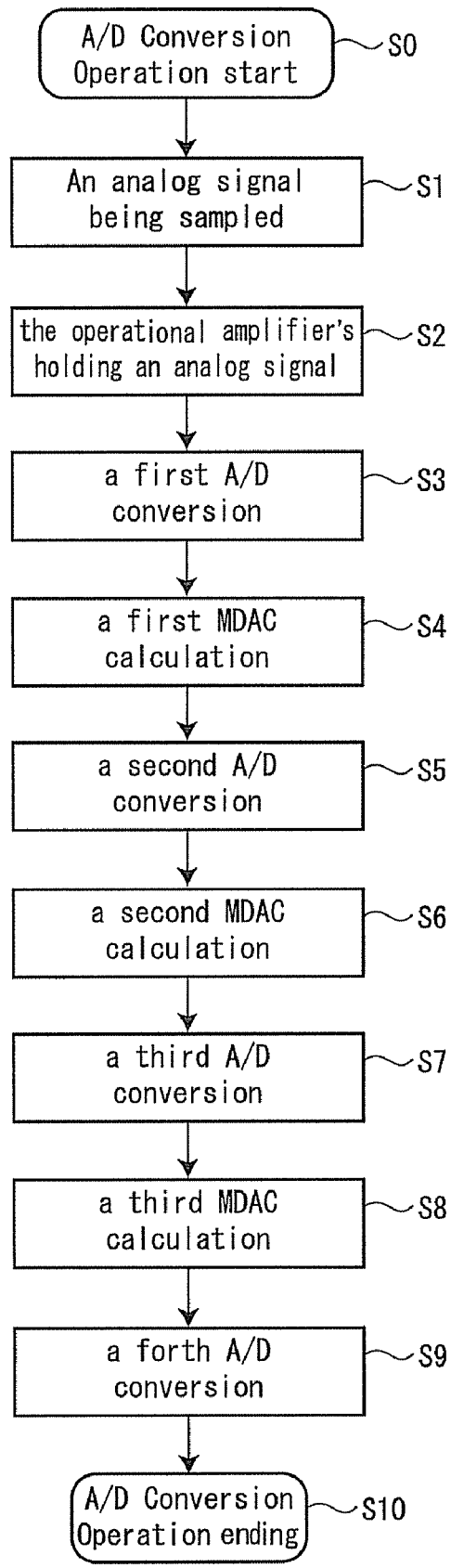
FIG. 4 is a flowchart showing the order of A/D conversion of the A/D converter of FIG. 1.
Figure 5:
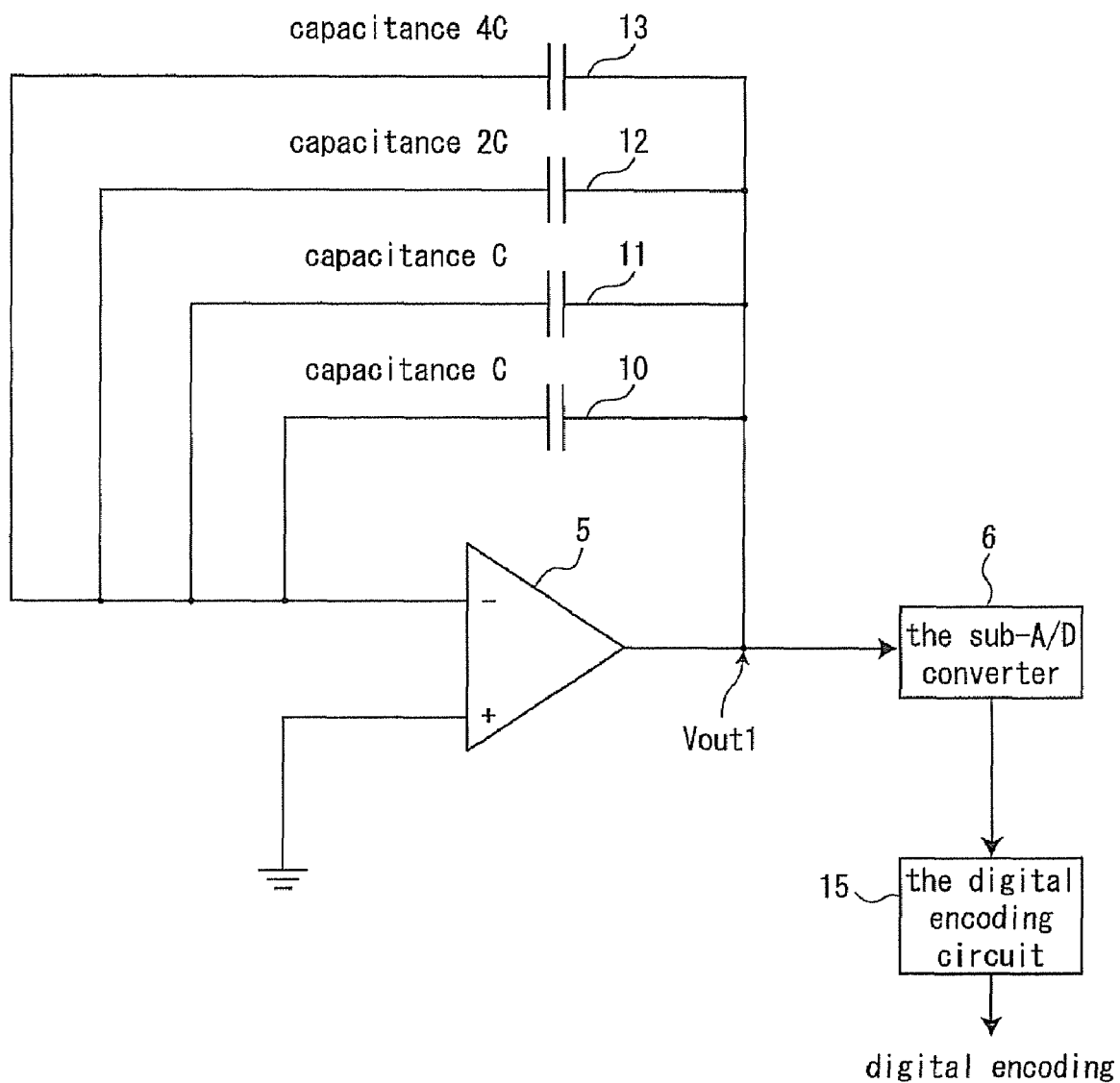
FIG. 5 is a view showing an equivalent circuit at first sample and hold time in the A/D converter of FIG. 1.
Figure 6:
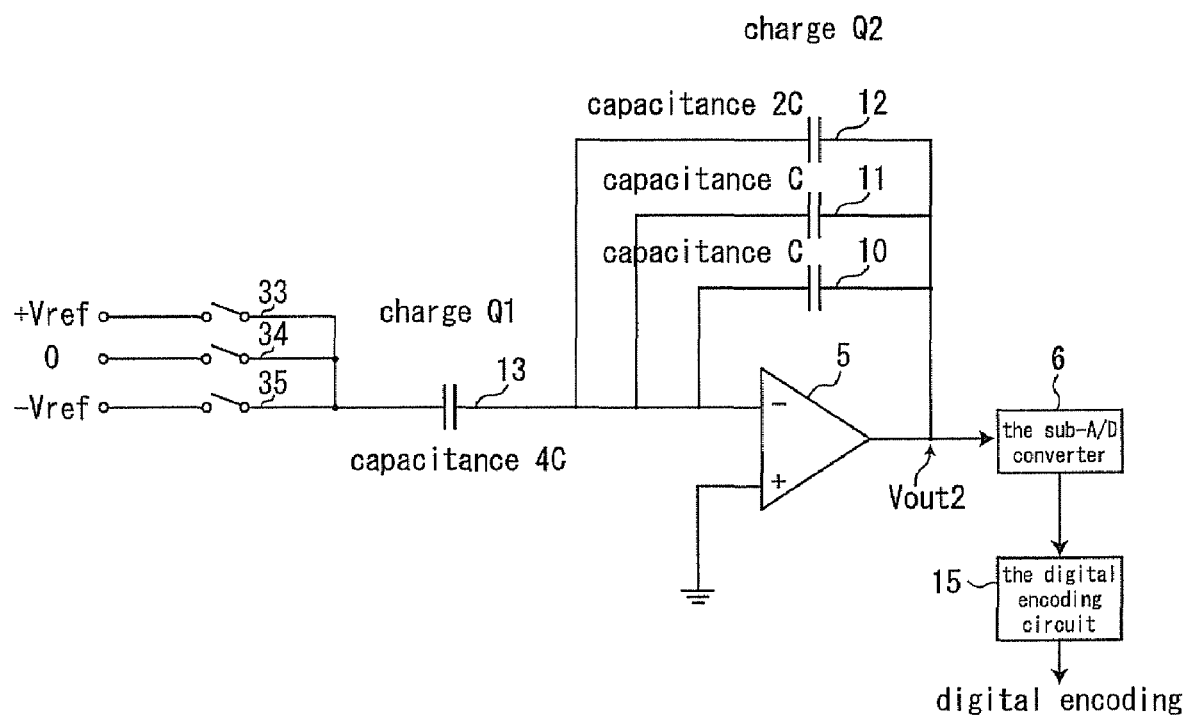
FIG. 6 is a view showing the equivalent circuit at first MDAC calculation time in the A/D converter of FIG. 1.
Figure 7:
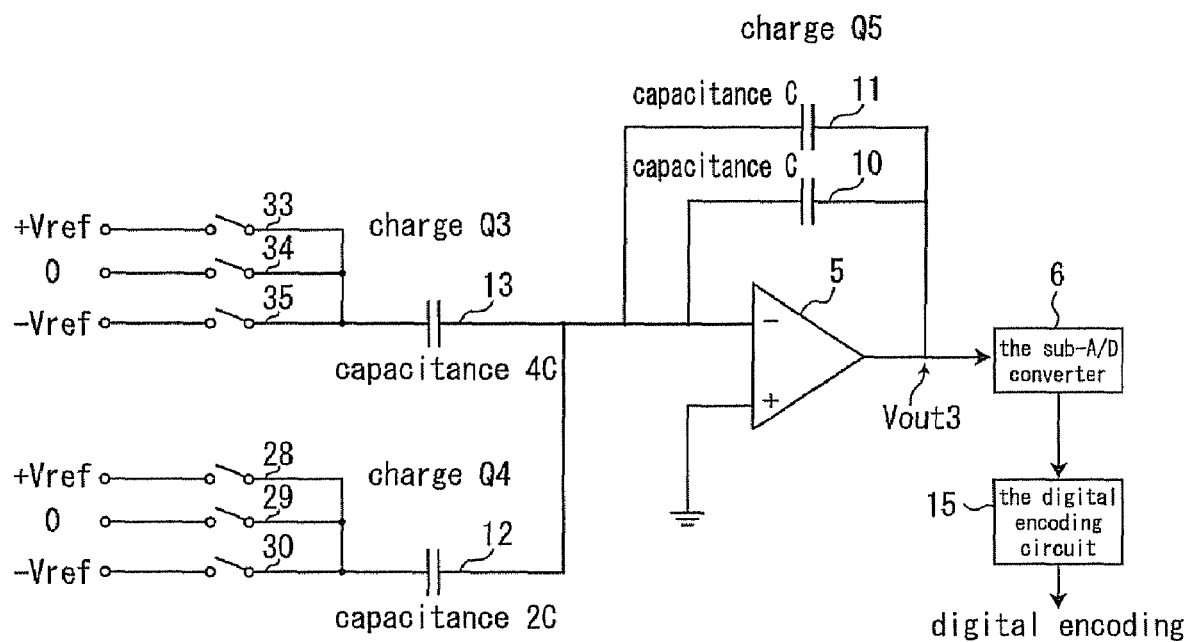
FIG. 7 is a view showing the equivalent circuit at second MDAC calculation time in the A/D converter of FIG. 1.
Figure 8:
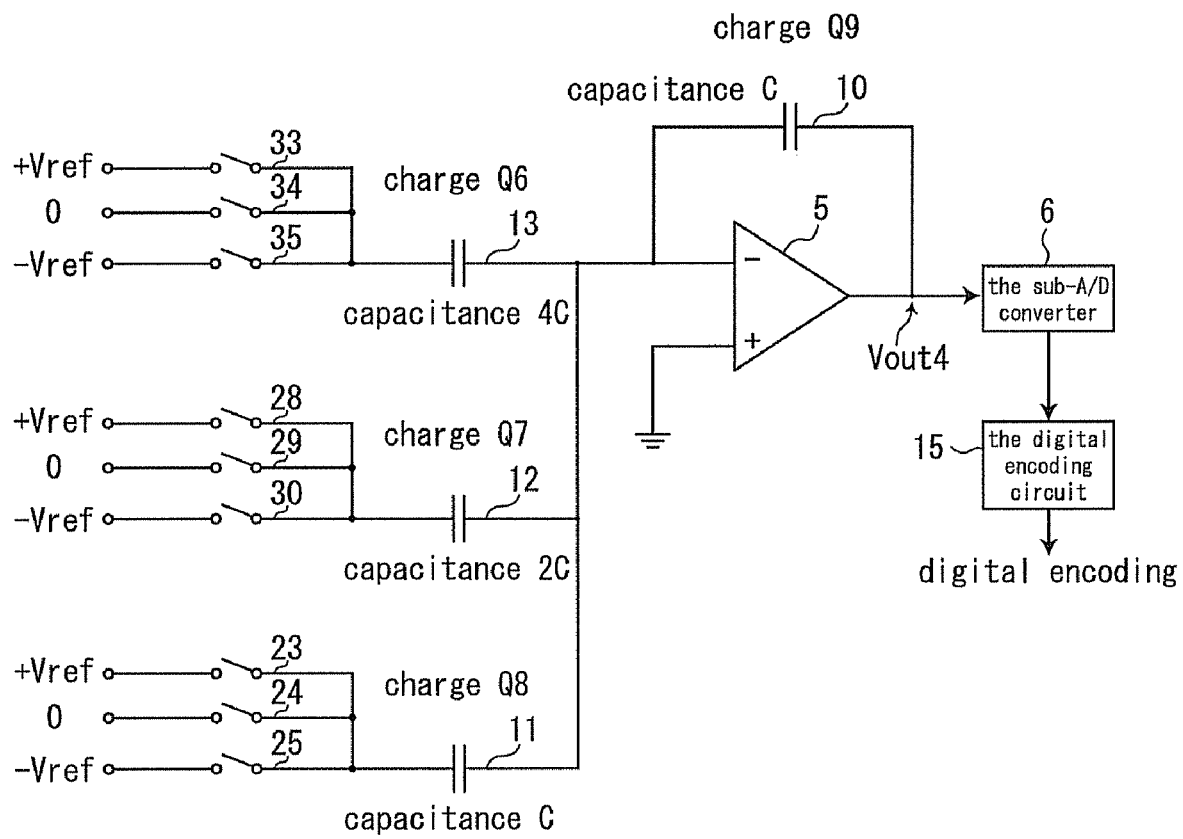
FIG. 8 is a view showing the equivalent circuit at third MDAC calculation time in the A/D converter of FIG. 1.

FIG. 4 is a flowchart showing a calculation order of an A/D conversion made by the A/D converter of FIG. 1. FIG. 5 is a view showing an equivalent circuit at first sample and hold time in the A/D converter of this embodiment. FIG. 6 is a view showing the equivalent circuit at first MDAC calculation time in the A/D converter of this embodiment. FIG. 7 is a view showing the equivalent circuit at second MDAC calculation time in the A/D converter of this embodiment. FIG. 8 is a view showing the equivalent circuit at third MDAC calculation time in the A/D converter of this embodiment.

First, in the circuit shown in FIG. 1, all the switches are OFF. Next, the switches 20, 21, 26, 31, and 36 are turned on (Step S1). An analog signal Vin is sampled in the first capacitor 10 to the fourth capacitor 13. That is, the analog signal Vin is held, as a charge, in the first capacitor 10 to the fourth capacitor 13.

At this time, when denoting a sum of charges held in the first capacitor 10 to the fourth capacitor 13 as Q, a composite capacitance of the first capacitor 10 to the fourth capacitor 13 becomes 8C, so that Q is expressed by the following equation.

$$Q = 8C \cdot V\text{in} \tag{2}$$

After a certain period of time has elapsed, the switches 20, 21, 26, 31, and 36 are turned off. Thereafter, Q is held in the first capacitor 10 to the fourth capacitor 13.

Subsequently, the switches 22, 27, 32, and 37 are turned on (Step S2). In this case, the circuit of FIG. 1 becomes equivalent to the one shown in FIG. 5.

In the circuit of FIG. 5, the output terminal and the input terminal (−) of the operational amplifier 5 are connected through a capacitor, and a negative feedback is achieved. At this time, this circuit operates so that a difference between voltages inputted in the input terminal (+) and the input terminal (−) becomes zero. Therefore, since the input terminal (+) is grounded, the input terminal (−) is equivalently grounded.

Since the input terminal (−) of the operational amplifier 5 is equivalently grounded, the first output voltage Vout1 of the operational amplifier 5 is outputted according to the charge held in the first capacitor 10 to the fourth capacitor 13.

At this time, the charge held in the first capacitor 10 to the fourth capacitor 13 is Q shown in Equation (2), and the composite capacitance of the first capacitor 10 to the fourth capacitor 13 becomes 8C, so that Vout1 is expressed by the following equation.

$$V\text{out1} = Q/8C = V\text{in} \tag{3}$$

At this time, the sample and hold function for the analog signal is terminated. Thereafter, the process moves to Step S3.

Next, the sub-A/D converter 6 performs a first A/D conversion according to the principle of the A/D conversion shown in FIG. 2 (Step S3). That is, Vout1 is converted to a first digital value in binary code so that a value of D1 is determined. The first digital value is thereafter sent to the digital encoding circuit 15. The switches 22, 27, 32, and 37 are then turned off.

Next, the first MDAC calculation is performed as follows (Step S4).

According to the value of D1, one of the switches 33, 34 and 35 is selected. At this time, when D1=1, the switch 33 is selected; when D1=0, the switch 34 is selected; and when D1=−1, the switch 35 is selected.

Next, one selected from the switches 33 to 35, and the switches 22, 27 and 32 are turned on. In this case, the circuit of FIG. 1 becomes equivalent to the one shown in FIG. 6.

At this time, a charge held in the fourth capacitor 13 is denoted by Q1, and a charge held in the first capacitor 10 to the third capacitor 12 is denoted by Q2. The composite capacitance of the first capacitor 10 to the third capacitor 12 becomes 4C.

The circuit shown in FIG. 6 is the one in which a negative feedback is achieved as in the circuit shown in FIG. 5, and the input terminal (−) of the operational amplifier 5 is equivalently grounded.

Since the input terminal (−) of the operational amplifier 5 is equivalently grounded, a voltage held in the first capacitor 10 to the third capacitor 12 is outputted as an output voltage of the operational amplifier 5. This output voltage is a result of the MDAC calculation. This output voltage Vout2 is obtained using Q2 as follows.

$$V\text{out2} = Q2/4c \tag{4}$$

Next, according to the law of conservation of charge, the sum of Q1 and Q2 becomes equal to the charge Q which is firstly sampled.

$$Q = Q1 + Q2 \tag{5}$$

According to Equation (5), Q2 is expressed using the following equation.

$$Q2 = Q - Q1 \tag{6}$$

Next, a voltage to be applied to fourth capacitor 13 becomes D1*Vref. Accordingly, Q1 is expressed using the following equation.

$$Q1 = 4C \cdot D1 \cdot V\text{ref} \tag{7}$$

Using Equations (2), (5), (6) and (7) above, Q2 becomes the following value.

$$Q2 = 8C \cdot V\text{in} - 4C \cdot D1 \cdot V\text{ref} \tag{8}$$

Using Equations (4) and (8), Vout2 is given as follows.

$$V\text{out2} = 2V\text{in} - D1 \cdot V\text{ref}$$

$$(D1 = -1 \text{ or } 0 \text{ or } 1) \tag{9}$$

This Vout2 is a first MDAC calculation result.

Next, sub-A/D converter 6 performs a second A/D conversion according to the principle of the A/D conversion shown in FIG. 2 (Step S5). That is, Vout2 is converted into a second digital value in binary code so that D2 is determined. Subsequently, the second digital value is sent to the digital encoding circuit 15. Next, one selected from the switches 33 to 35, and the switches 22, 27 and 32 are turned off.

Next, a second MDAC calculation is performed as follows (Step S6).

One of the switches 33 to 35 is selected according to the value of D1.

One of the switches 28 to 30 is selected according to the value of D2. At this time, when D2=1, the switch 28 is selected; when D2=0, the switch 29 is selected; and when D2=−1, the switch 30 is selected.

Subsequently, one selected from the switches 33 to 35, one selected from the switches 28 to 30, and the switches 22, 27 are turned on. In this case, the circuit of FIG. 1 becomes equivalent to one shown in FIG. 7.

At this time, a charge held in the fourth capacitor 13 is denoted as Q3; a charge held in the third capacitor 12 is denoted as Q4; and a charge held in held in the first and the second capacitors 10 and 11 is denoted as Q5. A composite capacitance of the first and the second capacitors 10 and 11 becomes 2C.

The circuit shown in FIG. 7 is one in which a negative feedback is achieved as in the circuit shown in FIG. 5, and the input terminal (−) is equivalently grounded.

Since the input terminal (−) of the operational amplifier 5 is equivalently grounded, a voltage held in the first capacitor 10 and the second capacitor 11 is outputted as an output voltage of the operational amplifier 5. This output voltage is a result of the MDAC calculation. This output voltage Vout3 is obtained using Q5 as follows.

$$V\text{out3} = Q5/2C \tag{10}$$

Next, according to the law of conservation of charge, the sum of Q3, Q4, and Q5 becomes equal to the charge Q which is firstly sampled.

$$Q=Q3+Q4+Q5 \quad (11)$$

Using Equation (11), Q5 is expressed by the following equation.

$$Q5=Q-Q3-Q4 \quad (12)$$

Next, a voltage to be applied to the fourth capacitor 13 becomes D1·Vref. Further, a voltage to be applied to the third capacitor 12 becomes D2·Vref. Therefore, Q3 and Q4 are expressed by the following equations.

$$Q3=4C \cdot D1 \cdot V\text{ref} \quad (13)$$

$$Q4=2C \cdot D2 \cdot V\text{ref} \quad (14)$$

Using Equations (2), (12), (13) and (14) above, Q5 becomes the following value.

$$Q5=8C \cdot V\text{in}-4C \cdot D1 \cdot V\text{ref}-2C \cdot D2 \cdot V\text{ref} \quad (15)$$

Using Equations (10) and (15), Vout3 is given by the following equation.

$$V\text{out}3=4V\text{in}-2 \cdot D1-V\text{ref}-d2 \cdot V\text{ref}$$

$$(D1,D2=-1 \text{ or } 0 \text{ or } 1) \quad (1)$$

This Vout3 is a second MDAC calculation result.

Next, the sub-A/D converter 6 performs a third A/D conversion according to the principle of the A/D conversion shown in FIG. 2 (Step S7). That is, Vout3 is converted into a third digital value in binary code so that D3 is determined. Subsequently, the third digital value is sent to the digital encoding circuit 15. Next, one selected from the switches 33 to 35, one selected from the switches 28 to 30, and the switches 22, 27 are turned off.

Next, a third MDAC calculation is performed as follows (Step S8).

One of the switches 33 to 35 is selected according to a value of D1. One of the switches 28 to 30 is selected according to a value of D2. One of the switches 23 to 25 is selected according to a value of D3. At this time, when D3=1, the switch 23 is selected; when D3=0, the switch 24 is selected; and when D3=−1, the switch 25 is selected.

Subsequently, one selected from the switches 33 to 35, one selected from the switches 28 to 30, one selected from the switches 23 to 25, and the switch 22 are turned on. In this case, the circuit of FIG. 1 becomes equivalent to one shown in FIG. 8.

At this time, a charge held in the fourth capacitor 13 is denoted as Q6; a charge held in the third capacitor 12 is denoted as Q7; a charge held in held in the second capacitor 11 is denoted as Q8; and a charge held in held in the first capacitor 10 is denoted as Q9.

The circuit shown in FIG. 8 is the one in which a negative feedback is achieved as in the circuit shown in FIG. 5, and the input terminal (−) of the operational amplifier 5 is equivalently grounded.

Since the input terminal (−) of the operational amplifier 5 is equivalently grounded, a voltage held in the first capacitor 10 is outputted as an output voltage of the operational amplifier 5. This output voltage is a result of the MDAC calculation. This output voltage Vout4 is obtained using Q9 as follows.

$$V\text{out}4=Q9/C \quad (17)$$

Next, according to the law of conservation of charge, the sum of Q6, Q7, Q8, and Q9 becomes equal to the charge Q which is firstly sampled.

$$Q=Q6+Q7+Q8+Q9 \quad (18)$$

Using Equation (18), Q9 is expressed by the following equation.

$$Q9=Q-Q6-Q7-Q8 \quad (19)$$

Next, a voltage to be applied to the fourth capacitor 13 becomes D1·Vref. Further, a voltage to be applied to the third capacitor 12 becomes D2·Vref. Further, a voltage to be applied to the second capacitor 11 becomes D3·Vref. Therefore, Q6, Q7, and Q8 are expressed by the following equations.

$$Q6=4C \cdot D1 \cdot V\text{ref} \quad (20)$$

$$Q7=2C \cdot D2 \cdot V\text{ref} \quad (21)$$

$$Q8=C \cdot D3 \cdot V\text{ref} \quad (22)$$

Using Equations (2), (19), (20), (21), and (22) above, Q9 becomes the following value.

$$Q9=8C \cdot V\text{in}-4C \cdot D1 \cdot V\text{ref}-2C \cdot D2 \cdot V\text{ref}-C \cdot D3 V\text{ref} \quad (23)$$

Using Equations (17) and (23), Vout4 is given by the following equation.

$$V\text{out}4=8V\text{in}-4 \cdot D1-V\text{ref}-2 \cdot D2 \cdot V\text{ref}-D3 \cdot V\text{ref}$$

$$(D1,D2,D3=-1 \text{ or } 0 \text{ or } 1) \quad (24)$$

This Vout4 is a third MDAC calculation result.

Next, the sub-A/D converter 6 performs a fourth A/D conversion according to the principle of the A/D conversion shown in FIG. 2 (Step S9). That is, Vout4 is converted into a fourth digital value in binary code. Subsequently, the fourth digital value is sent to the digital encoding circuit 15.

Next, the digital encoding circuit 15 adds the first to fourth digital values according to the principle of digital encoding shown in FIG. 3, so that 5-bit digital encoding is performed. Subsequently, one selected from the switches 33 to 35, one selected from the switches 28 to 30, one selected from the switches 23 to 25, and the switch 22 are turned off. At this time, the A/D conversion operation is terminated.

As described above, since the sub-A/D converter having a redundancy is used in this embodiment, even in a state in which a residual signal is not completely settled, when the sum of an error of the residual signal and an error of the sub-A/D converter is less than a predetermined value, an accurate result using the A/D converter can be obtained. Therefore, the process is allowed to move to the next conversion stage immediately after the time when an error of a residual signal attains within a predetermined value. Hence, the sub-A/D converter having a redundancy is allowed to move to the next conversion stage at an earlier point of time compared to a sub-A/D converter having no redundancy.

Further, the MDAC calculation is repeated using the charge sampled first. Therefore, it is not necessary to repeat sampling, and noise due to the sampling is not accumulated.

That is, in this embodiment, since an accurate calculation due to a redundancy in calculation is not necessary, calculation cycle can be shortened, and an A/D converter with high noise tolerance can be configured. Further, since there is no delivery/receipt (sampling) of a charge, noise due to sampling is not accumulated.

Variation of this Embodiment

In this embodiment, an example of the A/D converter with 5 bit output has been presented, in which a conversion to a digital value is repeated four times using the sub-A/D converter 6. However, by changing a capacitance of a capacitor of the capacitor group 7 and the number of capacitors thereof, it is possible to configure an A/D converter, an output of which is not in 5 bits.

For example, in addition to the first capacitor 10 to the fourth capacitor 13 of the capacitor group 7, when the capacitor group 7 includes a capacitor of 8C eight times the capacitance of the first capacitor 10, the A/D converter becomes one having 6 bit output in which a conversion to a digital value is repeated five times using the sub-A/D converter 6.

In the same manner, when m and n are positive integers not less than 2, and when the capacitor group 7 includes the first capacitor 10 to an m-th capacitor, an n-th capacitor has a capacitance of $2^{(n-2)}*C$ (n=2, 3, . . . , m) where C represents the capacitance of the first capacitor 10. In this case, the A/D converter becomes one having (m+1) bit output in which a conversion to a digital value is repeated m times using the sub-A/D converter 6.

Further, in this embodiment, capacitors have been used in each of which a capacitance value is weighted according to a binary code being $2^{(n-2)}*C$. However, without being limited to the configuration method of a capacitor switch group employed in this embodiment, various other configuration methods are possible including, for example, one in which all the capacitors are configured to have unit capacitance C.

Second Embodiment

An A/D converter of a second embodiment of the present invention will be described. The second embodiment is an embodiment in which a pipeline A/D converter is configured in an application of the principle of the first embodiment of the present invention.

Configuration of Second Embodiment

Figure 9:
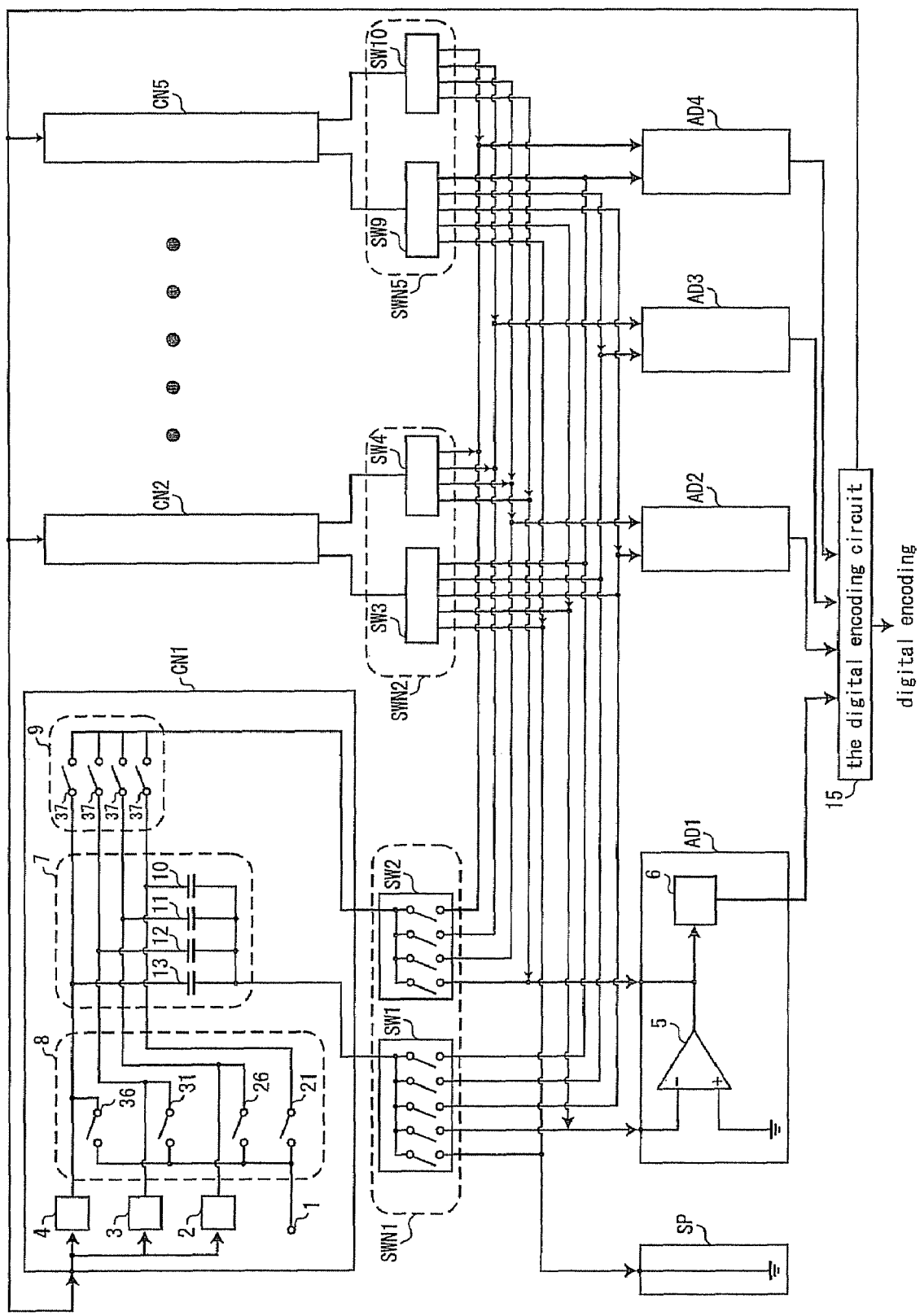
FIG. 9 is a block diagram showing an A/D converter of a second embodiment.

FIG. 9 is a block diagram showing an A/D converter of the second embodiment.

This embodiment has capacitor networks CN1 to CN5, switch networks SWN1 to SWN5, a sampling unit SP, A/D converters AD1 to AD4, and a digital encoding circuit 15. Incidentally, capacitor networks CN3 and CN4, and switch networks SWN3 and SWN4 are not depicted in FIG. 9.

Capacitor network CN1 includes an external input terminal 1, reference voltage selectors 2 to 4, a capacitor group 7, a first switch group 8, and a second switch group 9. Configurations and connections of the external input terminal 1, the capacitor group 7, the first switch group 8, and the second switch group 9 are the same as those of the first embodiment so that further descriptions thereof are omitted.

When an absolute value of a reference voltage in an A/D converter of this embodiment is denoted as Vref, as in the case of the first embodiment, the reference voltage selectors 2 to 4 are circuits each selecting one of voltages, i.e., a positive reference voltage +Vref, 0 volt, and a negative reference voltage −Vref, in accordance with a digital value in binary code, having 1.5 bit of information, converted by the sub-A/D converter 6 in A/D converters AD1 to AD4. In addition, as in the first embodiment, a digital value in binary code is supplied to the digital encoding circuit 15.

The capacitor network CN1 stores an analog signal, inputted from the external input terminal 1, in the capacitor group 7 as a charge. Subsequently, after a digital value in binary code is supplied, predetermined voltages are selected by the reference voltage selectors 2 to 4 in accordance with the digital value in binary code, and the capacitor network CN1 transfers a charge stored in the capacitor group 7 using the first switch group 8 and the second switch group 9.

Further, for capacitor network CN1, the number of times of converting of voltage is determined according to the number of switches in the first switch group 8 and the second switch group 9. In this embodiment, this number of times is four.

The capacitor networks CN2 to CN5 have configurations each being the same as that of capacitor network CN1.

The switch network SWN1 is a collection of switches, and includes a switch group 1 and a switch group 2. The switch group SW1 connects one ends of the capacitor group 7 to the sampling unit SP, or to input terminals (−) of operational amplifiers of A/D converters AD1 to AD4. The switch group SW2 connects one ends of the second switch group 9 of capacitor network CN1 to output terminals of the operational amplifiers of A/D converters AD1 to AD4.

The switch networks SWN2 to SWN5 each have two switch groups as in the case of the switch network SWN1. That is, the switch network SWN2 includes switch groups SW3 and SW4; the switch network SWN3 includes switch groups SW5 and SW6; the switch network SWN4 includes switch groups SW7 and SW8; and the switch network SWN5 includes switch groups SW9 and SW10.

Further, as in the function of the switch group SW1 to the capacitor network CN1, the switch groups SW3, SW5, SW7, and SW9 respectively connect one ends of capacitor groups of the capacitor networks CN2 to CN5, to the sampling unit SP, or to input terminals (−) of the operational amplifiers of A/D converters AD1 to AD4.

Further, as in the function of the switch group SW2 to the capacitor network CN1, the switch groups SW4, SW6, SW8, and SW10 respectively connect one ends of the second switch group 9 of the capacitor networks CN2 to CN5, to output terminals of the operational amplifiers of A/D converters AD1 to AD4.

The above-described switch networks SWN1 to SWN5 connect the capacitor networks CN1 to CN5, to the sampling unit SP and A/D converters AD1 to AD4 in one-to-one correspondence. That is, to one capacitor network, the sampling unit SP or one A/D converter is connected.

The sampling unit SP is grounded at one end thereof, and used when sampling analog signals inputted in capacitors of the capacitor networks CN1 to CN5. Incidentally, this grounding is to determine a reference point of a potential in a circuit, and, for example, the connection may be made at 0 v.

An A/D converter AD1 includes a operational amplifier 5, and a sub-A/D converter 6. The operational amplifier 5 and the sub-A/D converter 6 have the same functions as those of the first embodiment, so that further descriptions thereof are omitted.

The A/D converter AD1 is a circuit which is connected to the capacitor networks CN1 to CNn via the switch networks SWN1 to SWNn, and which performs an MDAC calculation, described in the first embodiment, based on charges stored in the capacitor networks CN1 to CNn. Thus, an analog signal is converted into a digital value. The converted digital value is supplied to the capacitor networks CN1 to CNn via the digital encoding circuit 15.

The A/D converters AD2 to AD4 each also have the same configuration and function as those of the A/D converter AD1.

The digital encoding circuit 15 is the same circuit as that of the first embodiment so that a further description there is omitted.

A/D Converter Operation of Second Embodiment

Next, A/D conversion operation used in this embodiment will be described with reference to FIGS. 10A and 10B.

Figure 10:
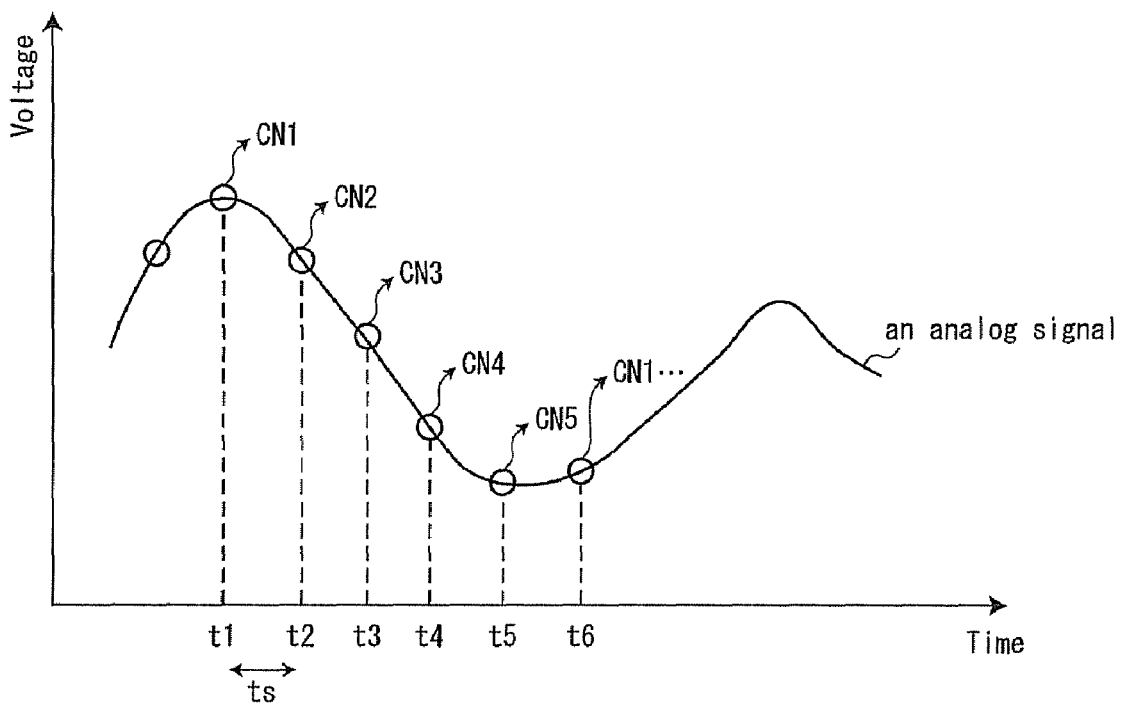
FIG. 10A is a view showing an analog signal, and an input state into a capacitor network.
FIG. 10B is a view showing a connection state between a capacitor network and a sampling unit SP or A/D converters.

FIG. 10A is a view showing an analog signal and an input state thereof in a capacitor network. FIG. 10B is a view showing a connection state between a capacitor network, and the sampling unit SP or A/D converters. That is, the view shows which one of the sampling unit SP and A/D converters AD1 to AD4 a capacitor network is connected at arbitrary time via a switch network.

First, at time t1 shown in FIG. 10A, an analog signal at time t1 is inputted in the capacitor network CN1.

At this time t1, a connection state of the capacitor networks CN1 to CN5 is as shown in FIG. 10B. That is, the capacitor network CN1 samples the inputted analog signal without being connected to the A/D converters. The capacitor network CN2 is connected to the A/D converter AD4 via a switch network. Subsequently, switches in the capacitor network CN2 are switched, so that the circuit configuration of FIG. 7 is changed to that of FIG. 8, and that a third MDAC calculation and a fourth A/D conversion are performed. The capacitor network CN3 is connected to the A/D converter AD3 via a switch network. Subsequently, switches in the capacitor network CN3 are switched, so that the circuit configuration of FIG. 6 is changed to that of FIG. 7, and that a second MDAC calculation and a third A/D conversion are performed. The capacitor network CN4 is connected to the A/D converter AD2 via a switch network. Subsequently, switches in the capacitor network CN4 are switched, so that the circuit configuration of FIG. 5 is changed to that of FIG. 6, and that a first MDAC calculation and a second A/D conversion are performed. The capacitor network CN5 is connected to the A/D converter AD1 via a switch network, and the circuit becomes the circuit configuration of FIG. 5, so that a first A/D conversion is performed.

Next, at time t2, the capacitor network CN1 is connected to the A/D converter AD1; the capacitor network CN2 is connected to the sampling unit SP; the capacitor network CN3 is connected to the A/D converter AD4; the capacitor network CN4 is connected to the A/D converter AD3; and the capacitor network CN5 is connected to the A/D converter AD2.

Incidentally, in this embodiment, sampling time is represented by ts as shown in FIG. 10A.

In the same manner, a capacitor network into which the analog signal is inputted is changed with time from the capacitor network CN1 to the capacitor network CN5. A subject to which each capacitor network is connected is changed from the sampling unit SP to the A/D converter AD1 to the A/D converter AD4. These series of connecting operations are repeated.

When being connected to the sampling unit SP, each capacitor network performs sampling on an analog signal. When being connected to the A/D converter AD1, the circuit configuration becomes one shown in FIG. 5, and a first A/D conversion is performed. When being connected to the A/D converter AD2, the circuit configuration of FIG. 5 becomes that of FIG. 6, and a first MDAC calculation and a second A/D conversion are performed. When being connected to the A/D converter AD3, the circuit configuration of FIG. 6 becomes that of FIG. 7, and a second MDAC calculation and a third A/D conversion are performed. When being connected to A/D converter AD4, the circuit configuration of FIG. 7 becomes that of FIG. 8, and a third MDAC calculation and a fourth A/D conversion are performed.

As described above, in this embodiment, by switching connections between capacitor networks, and the sampling unit SP or a plurality of A/D converters, an A/D conversion in pipeline operation is achieved. Accordingly, a sampling time interval becomes small compared with the first embodiment, so that a conversion rate of A/D conversion can be increased.

Variation of Second Embodiment

In this embodiment, an example of the A/D converter with 5 bit output has been presented, in which a conversion to a digital value is repeated four times using an A/D converter. However, as in the first embodiment, the capacitance of a capacitor of the capacitor group 7, the number of capacitors thereof, and the number of A/D converters may be changed so that this embodiment can be applied to an A/D converter, an output of which is not in 5 bits.

In this embodiment, five capacitor networks have been used, but any other number of capacitor networks can be used. At this time, the number of sampling units is one, and sampling units and A/D converters are configured so that the sum of the numbers of sampling units and A/D converters is equal to the number of capacitor networks.

Other Embodiments

By changing a redundancy of a sub-A/D converter, the first and second embodiments can be also applied to an A/D converter with a redundancy being other than 5 bits, for example, 2.5 bits or 3.5 bits.

When the redundancy is 2.5 bits, a redundancy of 1 bit is added to a binary code of 2 bits so that the binary code becomes 3 bits in total. When performing digital encoding, a sub-A/D converter overlaps an LSB of a digital value in 3 bits which is converted at an n-th time, and an MSB of a digital value in 3 bits which is converted at an n+1-th time.

In the same way, when the redundancy is an arbitrary n·5 bits, a redundancy of 1 bit is added to a binary code of n bits so that the binary code becomes n+1 bits in total. When performing digital encoding, a sub-A/D converter overlaps an LSB of a digital value in n+1 bits, which is converted at an m-th time, and an MSB of a digital value in n+1 bits, which is converted at an m+1-th time.

Further, the first and second embodiments each can be configured to be one in which a conventional cyclic A/D converter and a conventional A/D converter are combined so as to be, for example, used for a specific calculation in an upper bit or a lower bit.

Still further, the circuit configurations of the first and second embodiments can be applied to those of differential circuits.

As described above, although the present invention has been described using the above-described embodiments, it is to be understood that the present invention is not limited to the embodiments, and various changes may be made therein without departing from the spirit of the present invention. Such changes are also included in the scope of the present invention.

What is claimed is:

1. An analog-to-digital converter, comprising:
    a plurality of capacitor networks each including a first switch group configured to be connected to an input terminal into which an analog signal is inputted; a capacitor group configured to be connected to the first switch group, and configured to store the analog signal inputted from the input terminal as a charge; a second switch group configured to be connected to the capacitor group, and configured to transfer the charge in the capacitor group; and a plurality of reference voltage selectors configured to be connected to the first switch group and the capacitor group, and each of which selects a predetermined voltage in accordance with the digital value;

a sampling unit grounded at one end thereof;

a plurality of A/D converters each including: a operational amplifier configured to subtract the predetermined voltage from a voltage generated in the capacitor group in conjunction with the transfer of the charge, and the operational amplifier then configured to set, as an output voltage, a voltage obtained by amplifying the result of the subtraction; and converter configured to be connected to the operational amplifier, and the converter configured to convert the output voltage into a digital value of a predetermined number of bits including a redundancy bit; and a plurality of switch networks each of which connects a corresponding one of the plurality of the capacitor networks to any one of the sampling unit and the plurality of A/D converters in one-to-one correspondence, wherein the switch networks change the connections among the plurality of capacitor networks, the sampling unit and the plurality of A/D converters, at each predetermined time intervals, so that a pipeline operation is performed.

2. The analog-to-digital converter according to claim 1, the digital value of a predetermined number of bits is a digital value in binary code in accordance with the output voltage.

3. The analog-to-digital converter according to claim 1, in the converter, MDAC calculation operation is held in accordance with the output voltage.

4. The analog-to-digital converter according to claim 1, the predetermined voltage is one of the following voltage, a positive reference voltage +Vref, 0volt, and a negative reference voltage −Vref.

5. The analog-to-digital converter according to claim 1, further comprising a digital encoding circuit which adds a plurality of the digital values together, and which performs an error correction.

6. The analog-to-digital converter according to claim 5, the error correction is that the digital values are overlapped and added.

* * * * *